United States Patent
Lin et al.

(10) Patent No.: US 9,870,320 B2
(45) Date of Patent: Jan. 16, 2018

(54) METHOD FOR DYNAMICALLY STORING A FLASH TRANSLATION LAYER OF A SOLID STATE DISK MODULE

(71) Applicant: QUANTA STORAGE INC., Taoyuan (TW)

(72) Inventors: Cheng-Yi Lin, Taoyuan (TW); Ying-Kai Yu, Taoyuan (TW); Yi-Long Hsiao, Taoyuan (TW)

(73) Assignee: QUANTA STORAGE INC., Taoyuan (TW)

( * ) Notice: Subject to any disclaimer, the term of this patent is extended or adjusted under 35 U.S.C. 154(b) by 148 days.

(21) Appl. No.: 15/132,267

(22) Filed: Apr. 19, 2016

(65) Prior Publication Data

US 2016/0342522 A1 Nov. 24, 2016

(30) Foreign Application Priority Data

May 18, 2015 (CN) .......................... 2015 1 0251065

(51) Int. Cl.
*G06F 12/10* (2016.01)
(52) U.S. Cl.
CPC ...... *G06F 12/10* (2013.01); *G06F 2212/1044* (2013.01); *G06F 2212/2022* (2013.01)

(58) Field of Classification Search
None
See application file for complete search history.

(56) References Cited

U.S. PATENT DOCUMENTS

| | | | |
|---|---|---|---|
| 2009/0106486 A1* | 4/2009 | Kim | G06F 12/0246 711/103 |
| 2014/0237169 A1* | 8/2014 | Manning | G06F 12/0246 711/103 |
| 2014/0304453 A1* | 10/2014 | Shao | G06F 12/0246 711/103 |
| 2014/0337560 A1* | 11/2014 | Chun | G06F 12/0246 711/103 |
| 2015/0331624 A1* | 11/2015 | Law | G06F 12/10 711/103 |
| 2016/0246726 A1* | 8/2016 | Hahn | G06F 12/0862 |
| 2017/0177497 A1* | 6/2017 | Chun | G06F 12/1009 |

* cited by examiner

*Primary Examiner* — John A Lane
(74) *Attorney, Agent, or Firm* — Winston Hsu

(57) ABSTRACT

A shared memory is initially set in the solid state module. A command for accessing information is received. The translation time of the flash translation layer is measured. The translation time is compared to a predetermined time. Dynamic storing of the flash translation layer is initialized. And, the flash translation layer is moved to the shared memory to increase efficiency.

11 Claims, 5 Drawing Sheets

METHOD FOR DYNAMICALLY STORING A FLASH TRANSLATION LAYER OF A SOLID STATE DISK MODULE

BACKGROUND OF THE INVENTION

1. Field of the Invention

The present invention presents a method of dynamically storing a flash translation layer of a solid state module, more particularly, a method of dynamically storing a flash translation layer of a solid state module according to an efficiency of the flash translation layer of each of the solid state disks of the solid state module.

2. Description of the Prior Art

A solid state disk (SSD) is a memory formed using a NAND flash memory array. The NAND flash memory array has a finite number of erase cycles. Because of the finite number of erase cycles, the information is stored separately and flash translation layers (FTL) are used to establish a mapping table for the logical address and the physical address of the information. The mapping table is used to manage the relationship between the logical address and the physical address of the information when the information is being accessed. A plurality of solid state disks are then used to form a solid state module for increasing memory capacity.

FIG. 1 illustrates a storage system 1 of an electronic device according to prior art. The electronic device may be a computer, a cellphone, etc. The host 2 of the storage system 1 has a central processing unit 3 fitted with a dynamic random access memory (DRAM) 4 used to transmit the logical address of the accessed information to a transfer interface 5 for outputting. A solid state module 6 uses a host bus adaptor (HBA) 7 to the transfer interface 5 to process the logical address of the accessed information received from the host 2. After the host bus adaptor 7 has processed the logical address, the host bus adaptor 7 transmits the logical address to a port multiplier 8. The port multiplier 8 is configured to distribute the logical address to the plurality of solid state disks 9, 10, and 11. The controllers 12, 13, and 14, each coupled to a corresponding solid state disk 9, 10, and 11, coordinate with a buffer memory 15 and 16 during processing. The information is accessed from the physical address of the NAND flash memories 17, 18, and 19 in each of the solid state disks 9, 10, and 11 corresponding to the logical address. The information is then stored in the dynamic random access memory 4 of the host 2 for future use.

For each of the solid state disks 9, 10, and 11 to be able to manage the relation between the logical address of the information and the physical address of the NAND flash memories 17, 18, and 19 where the information is stored, during the operation of each of the solid state disks 9, 10, and 11, the management data of each information block in the NAND flash memories 17, 18, and 19 is read separately. The mapping table of the logical address and the physical address of the information is formed by establishing flash translation layer to store and manage the mapping table. To establish the position of the flash translation layer, during the initialization of the solid state disks, the firmware stored in each of the NAND flash memories may be preset in the buffer memories or the NAND flash memories and may not be changed.

The size of the conventional solid state disk is dependent on the buffer memory. The following are modes of establishing position of the flash translation layer: The first mode is illustrated the solid state disk 9 shown in FIG. 1. For establishing the flash translation layer, when the size of the buffer memory 15 is not less than the estimated size of the mapping table, the establishing position 20 of the flash translation layer may be entirely set in the buffer memory 15. The full logical-to-physical (L2P) table mapping method is selectively used. The second mode is illustrated the solid state disk 10 shown in FIG. 1. When the size of the buffer memory 16 is less than the estimated size of the mapping table, the establishing position 21 of the flash translation layer may be partially set in the buffer memory 16 and the remaining part is established in the NAND flash memory 18. The partial L2P table mapping method is selectively used. The third mode is the solid state disk 11 shown in FIG. 1. When there is no buffer memory 16 set, the establishing position 22 of the flash translation layer may be entirely set in the NAND flash memory 19. The full array L2P table mapping method is selectively used.

Because the accessing speed of the dynamic random access memory is 10 times faster than NAND flash memory and the buffer memories 15 and 16 are dynamic random access memories, the accessing speed of the buffer memories 15 and 16 are faster than the NAND flash memories 17, 18, and 19. In consideration of the lifespan of the NAND flash memory, the information is scattered during storage. When each of the solid state disks of the solid state module 6 is in full storage mode, the flash translation layer is set in the buffer memory for the transmission speed of the flash translation layer to be fast, the accessing speed of each of the solid state disks to be equal to each other, the information to be gathered without waiting too long, and for the efficiency of accessing information to be at optimal.

However, each of the solid state disks of the conventional solid state module 6 has a flash translation layer that is set to different storage mode. More particularly, the consistency of the storage mode of the expandable solid state module 6 before and after the addition of the solid state disk is hard to maintain. When information of a file is scattered in solid state disks 9, 10, 11 having different storage modes, the solid state disk 9 using the full L2P table mapping method completes the accessing of information the fastest, the solid state disk 10 using the partial L2P table mapping method completes the accessing of information in 5 times the time needed by the solid state disk 9, and the solid state disk 11 using the full array L2P table mapping method completes the accessing of information in 10 times the time needed by the solid state disk 9. The host needs to wait for the solid state disk 11 to complete accessing before the information is completely accessible. Thus, decreasing the efficiency of the accessing the solid state module 6. Therefore, there is a need to improve the method of storing the flash translation layer of the solid state module.

SUMMARY OF THE INVENTION

An objective of the present invention is to present a method of dynamically storing flash translation layer of a solid state module. A shared memory is disposed in the solid state module to store the flash translation layer corresponding to a solid state disk that is not configured to use full logical-to-physical (L2P) table mapping method. In this way, the accessing efficiency is increased.

Another objective of present invention is to present method of dynamically storing flash translation layer of a solid state module. When the flash translation layer of a solid state disk is determined to have a low efficiency, the flash translation layer of the solid state disk is dynamically stored in a shared memory. In this way, the accessing speed is increased.

To achieve the abovementioned objectives, the method of dynamically storing a flash translation layer of a solid state module of the present invention may comprise setting a shared memory that is a dynamic random access memory, receiving a command to access information, measuring a translation time of a flash translation layer of a solid state disk, comparing the translation time of the flash translation layer to a predetermined time, initializing dynamic storing of the flash translation layer when the solid state disk is configured to use a partial L2P table mapping method or a full array L2P table mapping method, moving the flash translation layer of the solid state disk to the shared memory. When the translation time of the flash translation layer is not greater than the predetermined time, the solid state disk is configured to use a full L2P table mapping method, dynamic storing of the flash translation layer is not initialized, and accessing of information continues.

A host bus adaptor disposed in the solid state module processes the command to access the information. A port multiplier disposed in the solid state module then transmits the information to the solid state disk. The shared memory is coupled to the host bus adaptor. The solid state disk having a greater memory capacity is set by the solid state module to be a master solid state disk. The solid state module sets a buffer memory of the master solid state disk as the shared memory.

When moving the flash translation layer of the solid state disk to the shared memory, a part of the flash translation layer stored in a flash memory is moved to the shared memory. Or, the flash translation layer partially stored in the flash memory and the buffer memory is moved to the shared memory.

These and other objectives of the present invention will no doubt become obvious to those of ordinary skill in the art after reading the following detailed description of the preferred embodiment that is illustrated in the various figures and drawings.

DETAILED DESCRIPTION

To achieve the objective of the present invention, preferred embodiments of the present invention are described in the following paragraphs together with some illustrations.

Figure 1:
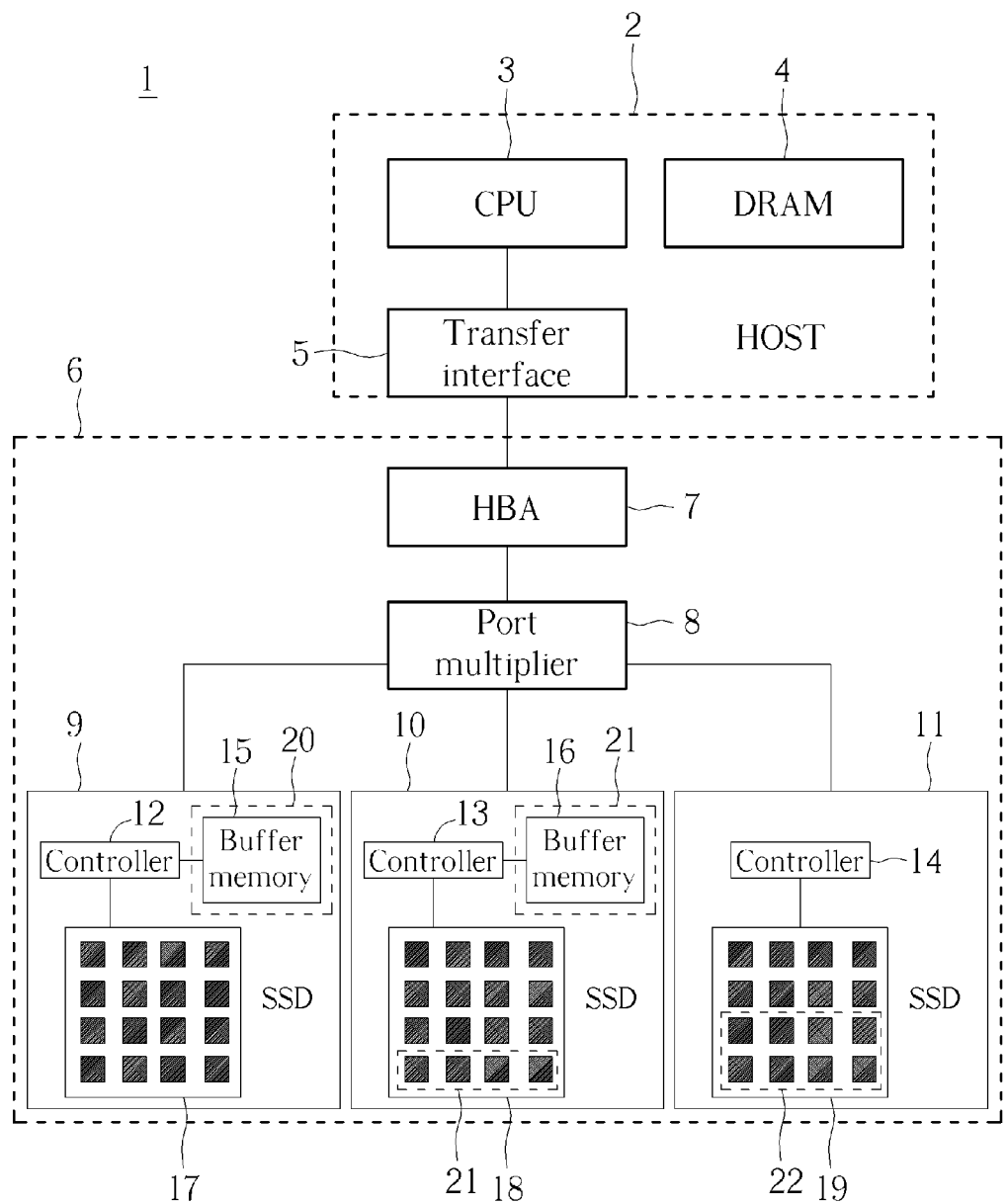
FIG. 1 illustrates a storage system of an electronic device according to prior art.
Figure 2:
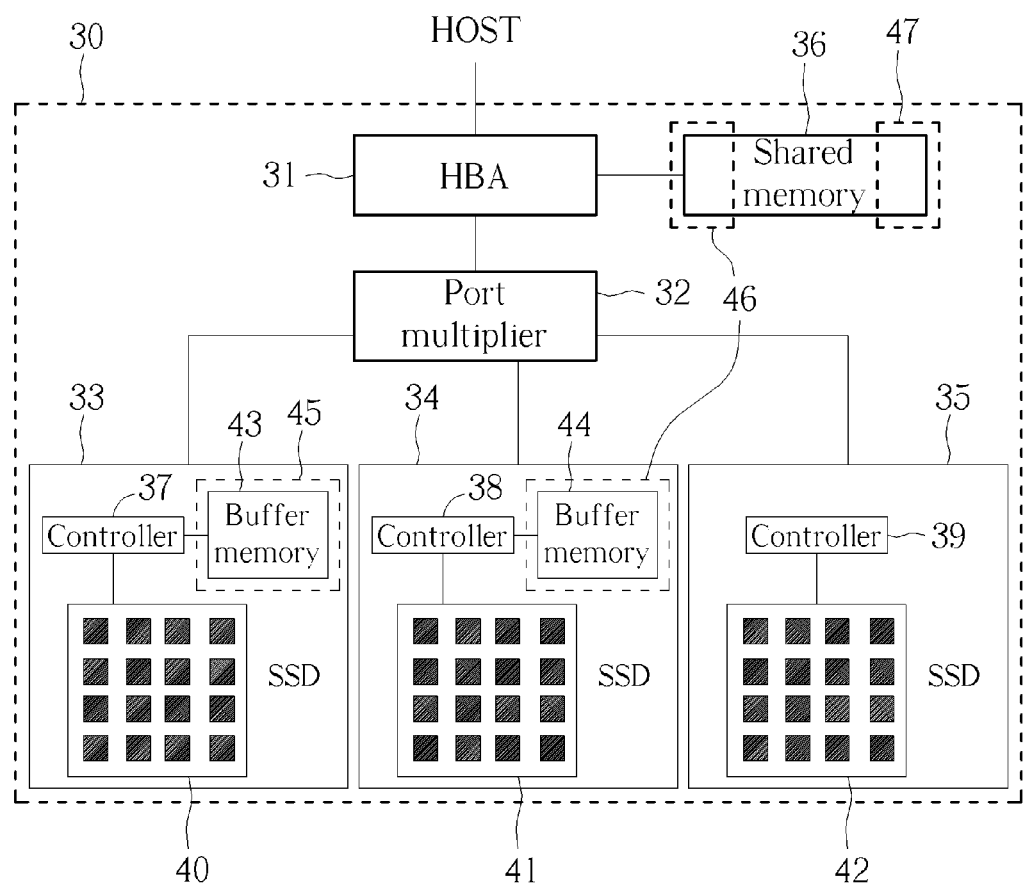
FIG. 2 illustrates a block diagram of a solid state module according to a first embodiment of the present invention.

FIG. 2 illustrates a block diagram of a solid state module according to a first embodiment of the present invention. The solid state module 30 comprises a host bus adaptor (HBA) 31, a port multiplier 32, a plurality of solid state disks 33, 34, and 35, and a shared memory 36. The solid state module 30 may be coupled to the host through the host bus adaptor 31 used to receive and process the accessed information of the host. The port multiplier 32 maybe coupled to the host bus adaptor 31 and may have a plurality of ports coupled to at least one solid state disk. For example, the embodiment in FIG. 1 may have three solid state disks including a solid state disk 33, a solid state disk 34, and a solid state disk 35. The port multiplier 32 may receive the accessed information processed in the host bus adaptor 31 and distribute the accessed information to the coupled solid state disks 33, 34, and 35. The solid state module 30 further has the shared memory 36 coupled to the host bus adaptor 31. The shared memory 36 may be a dynamic random access memory configured to store the flash translation layer of the solid state disks coupled to the port multiplier 32. Controllers 37, 38, and 39, NAND flash memories 40, 41, and 42, and buffer memories 43 and 44 are set within the plurality of solid state disks 33, 34, and 35. The controllers 37, 38, and 39 in coordination with the buffer memories 43 and 44 may access the information in the physical address corresponding to the logical address of the NAND flash memories 40, 41, and 42 of each of the solid state disks 33, 34, and 35 according to the accessed information distributed by the port multiplier 32 and allow the host to have access to the information.

In order for each of the solid state disks 33, 34, and 35 to manage the relation between the logical address of each information and the physical address of the NAND flash memories 40, 41, and 42, when initializing the solid state module 30, the solid state disks 33, 34, and 35 may individually read the managing information of each information block in the NAND flash memories 40, 41, and 42 to form the mapping table of the logical address and the physical address of the information. And, the flash translation layer is established according to the predetermined position of each of the solid state disks 33, 34, and 35 to store and manage the mapping table. For example, when the solid state disk 33 determines the predetermine size of the buffer memory 43 is not less than the estimated size of the mapping table, the flash translation layer may be entirely set in the buffer memory 43 to enable the use of a full logical-to-physical (L2P) table mapping method. The solid state disk 33 determines the predetermine size of the buffer memory 44 is less than the estimated size of the mapping table, the flash translation layer may be partially set in the buffer memory 44 and the remaining part may be set in the NAND flash memory 41 to enable the use of a partial L2P table mapping method. The solid state disk 35 may not have a buffer memory set. Thus, the flash translation layer may be entirely set in the NAND flash memory 42 to enable the use of a full array L2P table mapping method.

The buffer memories 43 and 44 may be dynamic random access memories. Because the accessing speed of the buffer memories 43 and 44 is 10 times faster than NAND flash memories 40, 41, and 42, when the port multiplier 32 of the solid state module 30 distributes the information processed in the host bus adaptor 31 to the plurality of solid state disks 33, 34, and 35, each of the controllers 37, 38, and 39 controls the corresponding flash translation layer to convert the logical address of the accessed information to the physical address of the NAND flash memory of the accessed information using the mapping table. During the measurement of the translation efficiency of the flash translation layer of the solid state disks 33, 34, and 35, the flash translation layer of the solid state disk 33 entirely set in the buffer memory 43 is measured to have the highest translation efficiency and the solid state disk 34 and the solid state disk 35 having flash translation layers partially or entirely set in the NAND flash memory is measured to have insufficient translation efficiencies.

For the flash translation layer to have sufficient translation efficiency, the time needed by the solid state disk for translation should be less than a predetermined time. The solid state disk 33 set to use the full L2P table mapping method has a translation time less than the predetermined time. Thus, the solid state module 30 will not perform dynamic storing of flash translation layer for the solid state disk 33 and the storage position 45 of the flash translation layer of the solid state disk 33 will be entirely set in the buffer memory 33 and not be adjusted. But, for the solid state disk 34 set to use the partial L2P table mapping method and the solid state disk 34 set to use the full array L2P table mapping method, the translation time for both is greater than the predetermined time. When the flash translation layer has insufficient translation efficiency, the solid state module 30 will perform the dynamic storing of flash translation layer. The storage position 46 of the flash translation layer of the solid state disk 34 partially set in the NAND flash memory 41 will be moved to the shared memory 36. The storage position 47 of the flash translation layer of the solid state disk 35 entirely set in the NAND flash memory 42 will be moved to the shared memory 36. In this way, the flash translation layers are all stored in dynamic random access memories such as the buffer memories 43 and 44 and the shared memory 36 to maintain a high accessing speed and increase the translation efficiency of the flash translation layers.

Therefore, when the solid state module 30 of the first embodiment is expanding capacity, the translation efficiency of the flash translation layer of the newly added solid state disk may be measured. When the translation efficiency of the newly added solid state is insufficient, dynamic storing of the flash translation layer may be performed. In this way the flash translation layer may be stored in the shared memory 36 that is a dynamic random access memory to increase the translation efficiency and maintain the accessing efficiency of the entire solid state module 30.

Figure 3:
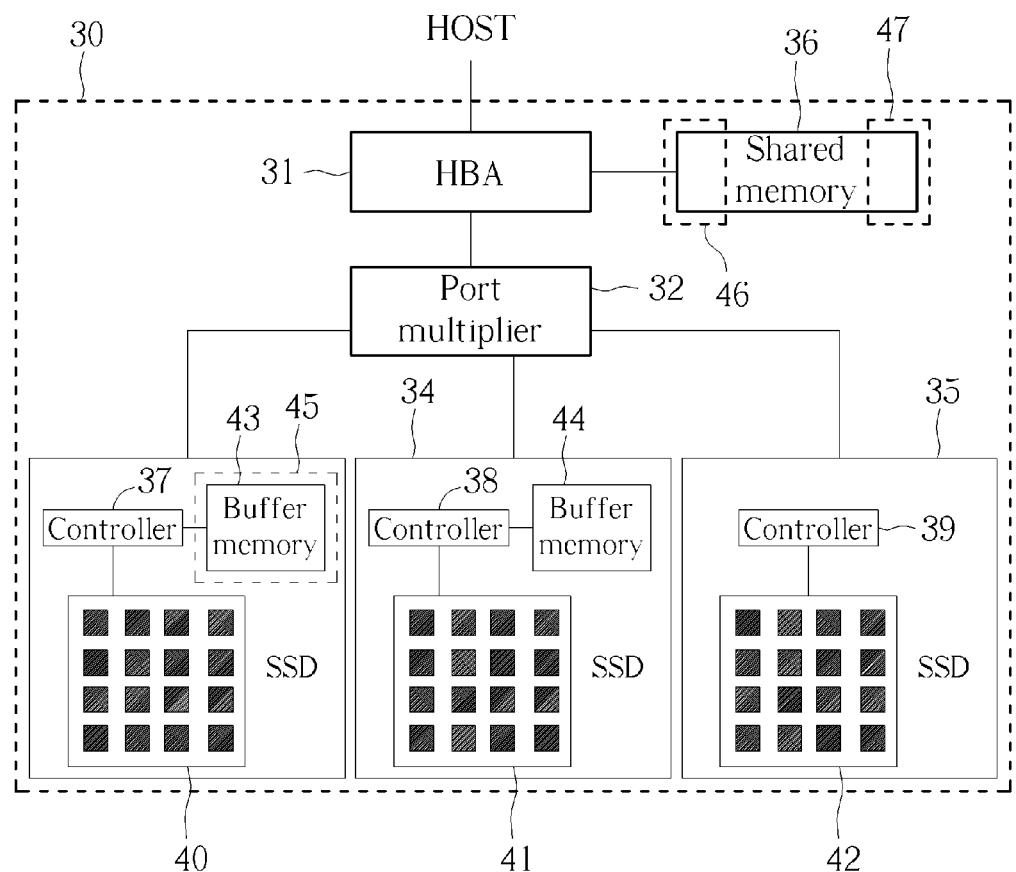
FIG. 3 illustrates a block diagram of a solid state module according to a second embodiment of the present invention.

FIG. 3 illustrates a block diagram of a solid state module according to a second embodiment of the present invention. The basic structure of the solid state module of the second embodiment is basically the same as that of the structure of the solid state module in FIG. 1. Thus, the structure is no longer described for brevity. The difference between the first embodiment and the second embodiment is in that the during the dynamic storing of flash translation layer in the first embodiment, only the portion of the flash translation layer stored in the NAND flash memory is moved to the shared memory 36. Whereas, in the second embodiment, when the solid state module 30 of the second embodiment is performing the dynamic storing of the flash translation layer, the shared memory 36 may be assumed to have a large memory capacity. In the same way as the first embodiment, the flash translation layers of the solid state disk 34 and solid state disk 35 are determined to have insufficient translation efficiency. Instead of having the flash translation layer of the solid state disk 34 partially set in the buffer memory 44 and the remaining part formed on the NAND flash memory 41, in the second embodiment, the storage position 46 of the flash translation layer of the solid state disk 34 is entirely set at the shared memory 36. Instead of having the flash translation layer of the solid state disk 35 entirely set in the NAND flash memory 42, in the second embodiment, the storage position 47 of the flash translation layer of the solid state disk 35 is also entirely set at the shared memory 36. In this way, the accessing efficiency of the entire solid state module 30 is increased.

Figure 4:
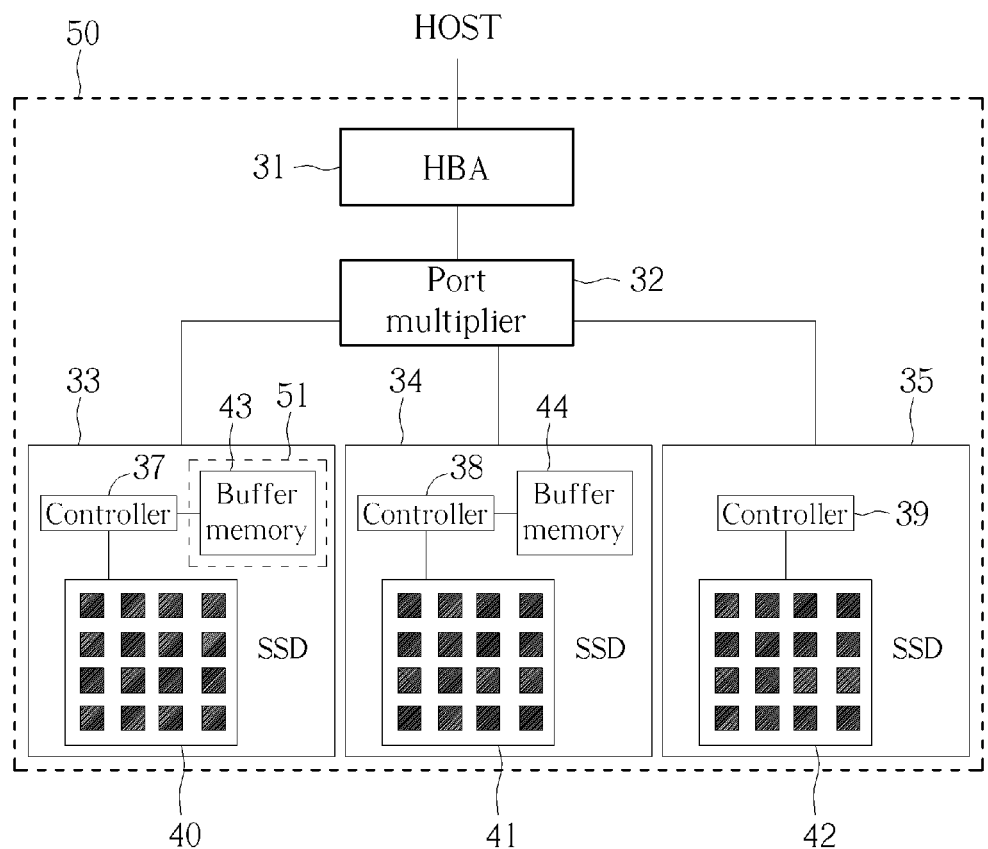
FIG. 4 illustrates a block diagram of a solid state module according to a third embodiment of the present invention.

FIG. 4 illustrates a block diagram of a solid state module according to a third embodiment of the present invention. The basic structure of the solid state module of the third embodiment is basically the same as that of the structure of the solid state module in FIG. 1 with the exception of the solid state module 50 of the third embodiment does not have a shared memory. Thus, the structure is no longer described for brevity. In the solid state module 50, the solid state disks are set to have buffer memories having large capacity to function as the shared memory of the solid state module 50. As shown in FIG. 4, the buffer memory 43 of the solid state disk 33 is set to have a large memory capacity. The solid state disk 33 is set to be the master solid state disk of the solid state module 50. Initially, the shared memory 51 of the solid state module 50 may be set. When dynamic storing of flash translation layer is being performed by the solid state module 50, the buffer memory 43 of the solid state disk 33 may not only store the flash translation layer of the solid state disk 33. In the same way as the first embodiment, the flash translation layers of the solid state disk 34 and solid state disk 35 are determined to have insufficient translation efficiency. Instead of having the flash translation layer of the solid state disk 34 partially set in the NAND flash memory 41, in the third embodiment, the part of the flash translation layer of the solid state disk 34 set in the NAND flash memory 41 is moved to the shared memory 51. Instead of having the flash translation layer of the solid state disk 35 entirely set in the NAND flash memory 42, in the third embodiment, the flash translation layer of the solid state disk 35 is also entirely set at the shared memory 51. In this way, the accessing efficiency of the entire solid state module 50 is increased.

Figure 5:
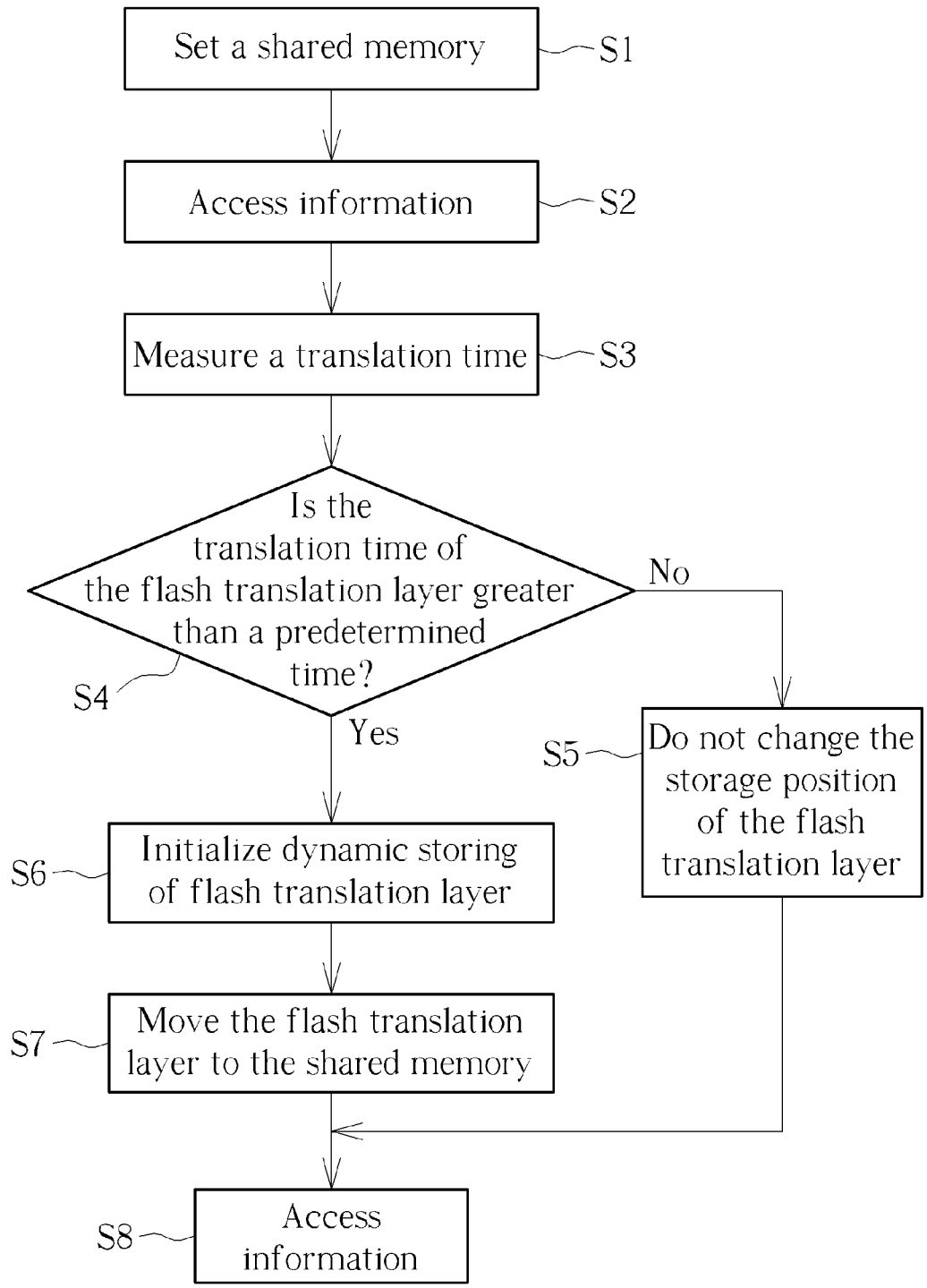
FIG. 5 illustrates a flowchart of a method of dynamically storing flash translation layer of a solid state module according to an embodiment of the present invention.

FIG. 5 illustrates a flowchart of a method of dynamically storing flash translation layer of a solid state module according to an embodiment of the present invention. The method may include but is not limited to the following steps:

Step S1: The solid state module setting a shared memory; the shared memory may be an additional memory or a buffer memory of a solid state disk;

Step S2: Receiving a command from the host to access information;

Step S3: Measuring a translation time of the flash translation layer of the solid state disk;

Step S4: Determining if the translation time of the flash translation layer is greater than or less than a predetermined time; If the translation time is greater than the predetermined time, go to step S5; If the translation time is less than the predetermined time, go to step S6;

Step S5: The storage position of the flash translation layer may not be changed, go to step S8;

Step S6: The solid state module initializing dynamic storing of flash translation layer;

Step S7: Moving the flash translation layer of the solid state disk to the shared memory; and Step S8: Continue accessing of the information.

The present invention presents a method of dynamically storing flash translation layer of a solid state module. The solid state module may have a shared memory. The solid state disks having flash translation layer with low translation efficiency may be determined. The dynamic storing of flash translation layer may be initialized to move the flash translation layer of the solid state disk having low efficiency to the shared memory. Where, the shared memory may be a dynamic random access memory. In this way, the accessing efficiency of the entire solid state module 50 is increased.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of dynamically storing a flash translation layer of a solid state module, the solid state module comprising at least one solid state disk, the method comprising:
setting a shared memory in the solid state module;
receiving a command to access information;
measuring a translation time of a flash translation layer of a solid state disk;
comparing the translation time of the flash translation layer to a predetermined time;
initializing dynamic storing of the flash translation layer; and
moving the flash translation layer of the solid state disk to the shared memory.

2. The method in claim 1, wherein the shared memory is a dynamic random access memory.

3. The method in claim 2, wherein the shared memory is an additional memory disposed in the solid state module.

4. The method in claim 3, further comprising:
a host bus adaptor disposed in the solid state module processing the command to access the information; and
a port multiplier disposed in the solid state module transmitting the information to the solid state disk;
wherein the shared memory is coupled to the host bus adaptor.

5. The method in claim 2, wherein the solid state disk having a greater memory capacity is set by the solid state module to be a master solid state disk.

6. The method in claim 5, further comprising:
the solid state module setting a buffer memory of the master solid state disk as the shared memory.

7. The method in claim 1, wherein when the translation time of the flash translation layer is not greater than the predetermined time, dynamic storing of the flash translation layer is not initialized and accessing of information continues.

8. The method in claim 7, wherein when the translation time of the flash translation layer is not greater than the predetermined time, the solid state disk is configured to use a full logical-to-physical (L2P) table mapping method.

9. The method in claim 1, wherein when the translation time of the flash translation layer is greater than the predetermined time, the solid state disk is configured to use a partial logical-to-physical (L2P) table mapping method or a full array L2P table mapping method.

10. The method in claim 1, wherein moving the flash translation layer of the solid state disk to the shared memory is moving a part of the flash translation layer stored in a flash memory to the shared memory.

11. The method in claim 1, wherein moving the flash translation layer of the solid state disk to the shared memory is moving the flash translation layer partially stored in the flash memory and the buffer memory to the shared memory.

* * * * *